(12) United States Patent
Wang et al.

(10) Patent No.: US 11,262,868 B2
(45) Date of Patent: Mar. 1, 2022

(54) DISPLAY PANEL, DRIVING METHOD AND TOUCH DISPLAY DEVICE

(71) Applicant: Xiamen Tianma Micro-Electronics Co.,Ltd., Xiamen (CN)

(72) Inventors: Ting Wang, Xiamen (CN); Hongbo Zhou, Xiamen (CN); Huangyao Wu, Xiamen (CN); Xiufeng Zhou, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 16/721,139

(22) Filed: Dec. 19, 2019

(65) Prior Publication Data

US 2021/0132767 A1 May 6, 2021

(30) Foreign Application Priority Data

Oct. 31, 2019 (CN) .......................... 201911051637.2

(51) Int. Cl.
*G06F 3/041* (2006.01)
*G06F 3/044* (2006.01)
*H01L 27/12* (2006.01)

(52) U.S. Cl.
CPC ........ *G06F 3/04166* (2019.05); *G06F 3/0446* (2019.05); *G06F 3/04164* (2019.05); *H01L 27/124* (2013.01)

(58) Field of Classification Search
CPC ............... G06F 3/04166; G06F 3/0446; G06F 3/04164; H01L 27/124
See application file for complete search history.

(56) References Cited

U.S. PATENT DOCUMENTS

| | | | |
|---|---|---|---|
| 2010/0127267 A1* | 5/2010 | Brown Elliott | G02F 1/1368 257/59 |
| 2016/0188061 A1* | 6/2016 | Cho | G06F 3/04166 345/173 |
| 2017/0031507 A1* | 2/2017 | Huang | G06F 3/0446 |
| 2019/0235294 A1* | 8/2019 | Wang | G02F 1/13338 |

FOREIGN PATENT DOCUMENTS

| CN | 103488332 B | 6/2016 |
|---|---|---|
| CN | 105573554 B | 2/2019 |

* cited by examiner

*Primary Examiner* — Wing H Chow
(74) *Attorney, Agent, or Firm* — Anova Law Group, PLLC

(57) ABSTRACT

A display panel, a driving method and a touch display device are provided. The display panel includes a display area and a non-display area. The display panel also includes a base substrate, a plurality of sub-pixels located in the display area and arranged in a first direction and a second direction, a plurality of electrode rows extending in the first direction and arranged in the second direction, a plurality of electrode columns arranged in the first direction and extending in the second direction, a plurality of switch units located in the display area, a plurality of first signal lines, a plurality of second signal lines, and a plurality of first driving circuits. In a touch stage, the first driving circuits supply a driving signal to the second signal lines, and the first signal lines transmit a touch detection signal to first electrodes in the electrode rows and columns.

18 Claims, 9 Drawing Sheets

DISPLAY PANEL, DRIVING METHOD AND TOUCH DISPLAY DEVICE

CROSS-REFERENCES TO RELATED APPLICATIONS

This application claims priority of Chinese Patent Application No. 201911051637.2, filed on Oct. 31, 2019, the entire content of which is hereby incorporated by reference.

FIELD OF THE DISCLOSURE

The present disclosure generally relates to the field of display technology and, more particularly, relates to a display panel, a driving method and a touch display device.

BACKGROUND

With development of science and technology, manufacturing of display panels tends towards maturity. More display panels are used in people's daily life and work, bringing great convenience to people. Current display panels mainly include liquid crystal display panel (LCD), organic light emitting diode display panel (OLED), plasma display panel, and the like.

To increase quality of a display image and appearance of a display device, increasing display size and resolution and decreasing frame width and body thickness are among main research and development directions for those skilled in the field of display technology. Thus, dimensions of display panels are getting larger.

FIG. 1 illustrates a structural diagram of a display panel 900 according to a conventional technology. As shown in FIG. 1, the display panel 900 generally includes touch electrode pieces 92 arranged in an array and touch signal lines 93 electrically connected to the touch electrode pieces 92 in one-to-one correspondence. Each touch electrode piece 92 is connected to an integrated circuit 91 through a corresponding touch signal line 93, such that the integrated circuit 91 may receive touch signals from any regions of the display panel 900. In this design, the display panel may have a large amount of traces at an area of a lower frame of the display panel. Accordingly, the lower frame of the display panel may have a large width, and thus a requirement for a narrow frame of the display panel may be difficult to be achieved.

The disclosed methods and structures are directed to solve one or more problems set forth above and other problems in the art.

SUMMARY

One aspect of the present disclosure includes a display panel. The display panel includes a display area and a non-display area surrounding the display area. The display panel also includes a base substrate, and a plurality of sub-pixels arranged in a first direction and a second direction. The plurality of sub-pixels located in the display area, and the first direction and the second direction intersect with each other. The display panel also includes a plurality of electrode rows extending in the first direction and arranged in the second direction, and a plurality of electrode columns arranged in the first direction and extending in the second direction. Each electrode row and each electrode column respectively include a plurality of first electrodes, and an orthographic projection of one first electrode on a plane of the base substrate covers at least two sub-pixels. The display panel also includes a plurality of switch units located in the display area. Each switch unit includes at least one first switch, and one first electrode is electrically connected to a first pole of at the least one first switch of a corresponding switch unit. The display panel also includes a plurality of first signal lines. A same electrode column corresponds to at least one first signal line, and a same first signal line is electrically connected to a second pole of the at least one first switch of a switch unit corresponding to a same electrode column. The at least one first signal line corresponding to a same electrode column is connected to a same first signal terminal, and the first signal lines corresponding to different electrode columns are connected to different first signal terminals. The display panel also includes a plurality of second signal lines. A same electrode row corresponds to at least one second signal line, and a same second signal line is electrically connected to a gate of the at least one first switch of the switch unit corresponding to one first electrode in the same electrode row. The display panel also includes a plurality of first driving circuits located in the non-display area. Each second signal line corresponding to a same electrode row is connected to at least a same first driving circuit. In a touch stage, the first driving circuits supply a driving signal to the second signal lines corresponding to the electrode rows, such that the switch units electrically connected to the second signal lines are turned on, and the first signal lines transmit a touch detection signal to the first electrodes electrically connected to the switch units that are turned-on.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 10 illustrates another layout diagram of first electrodes in a display panel consistent with the disclosed embodiments of the present disclosure;

DETAILED DESCRIPTION

To make the objectives, technical solutions and advantages of the present disclosure more clear and explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

Figure 1:
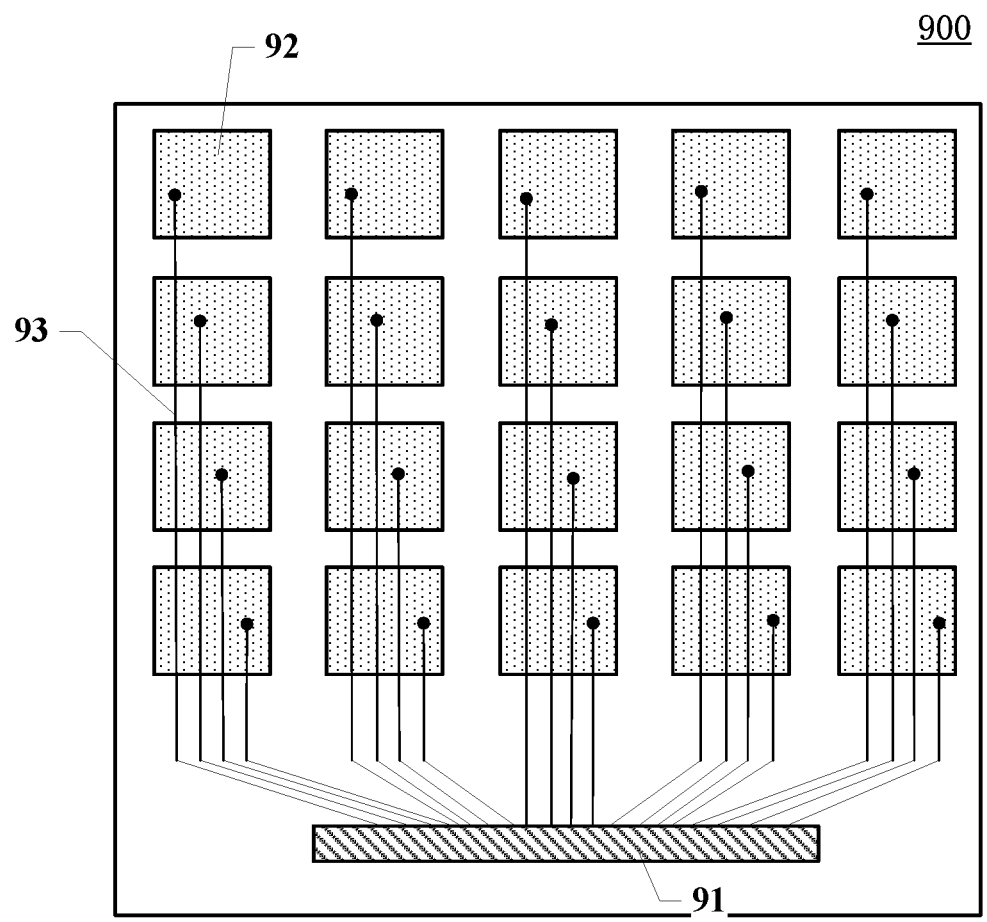
FIG. 1 illustrates a structural diagram of a display panel according to a conventional technology.
Figure 2:
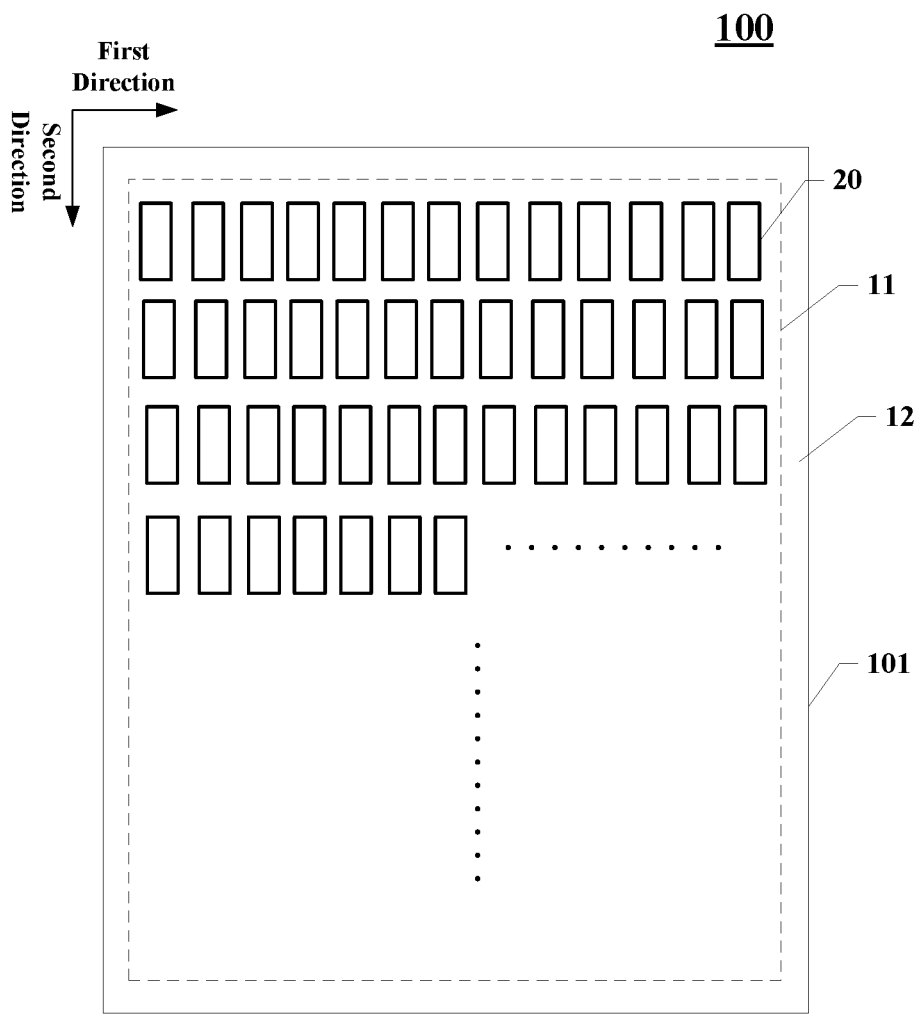
FIG. 2 illustrates a layout diagram of sub-pixels in a display panel consistent with the disclosed embodiments of the present disclosure.
Figure 3:
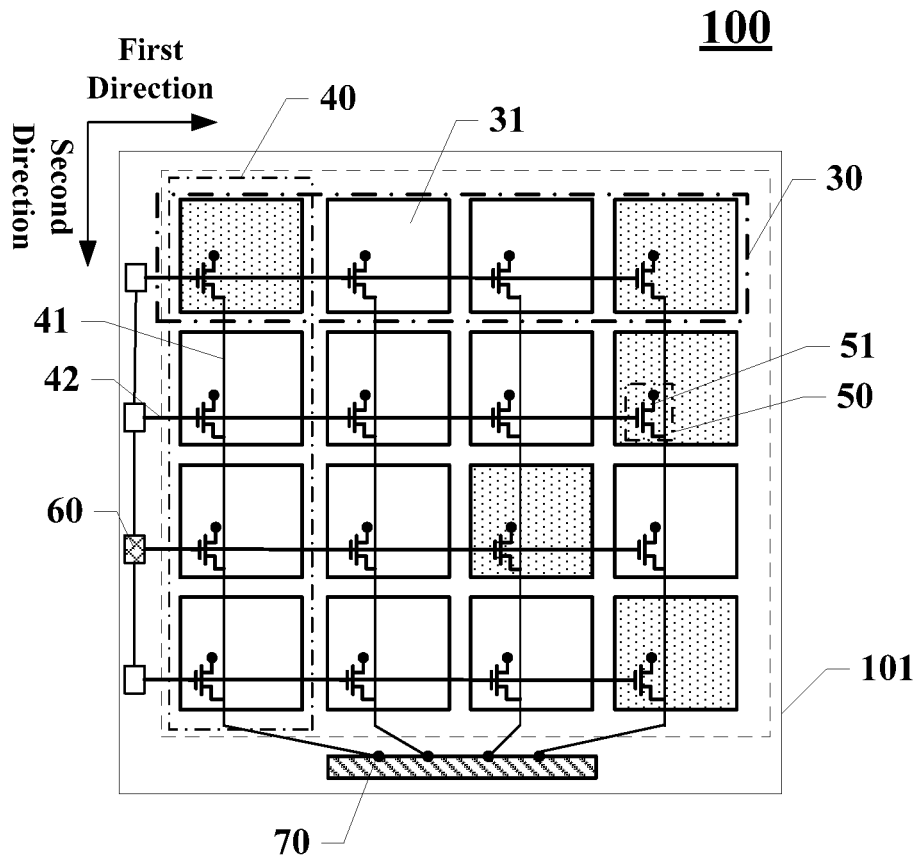
FIG. 3 illustrates a layout diagram of first electrodes in a display panel consistent with the disclosed embodiments of the present disclosure.
Figure 4:
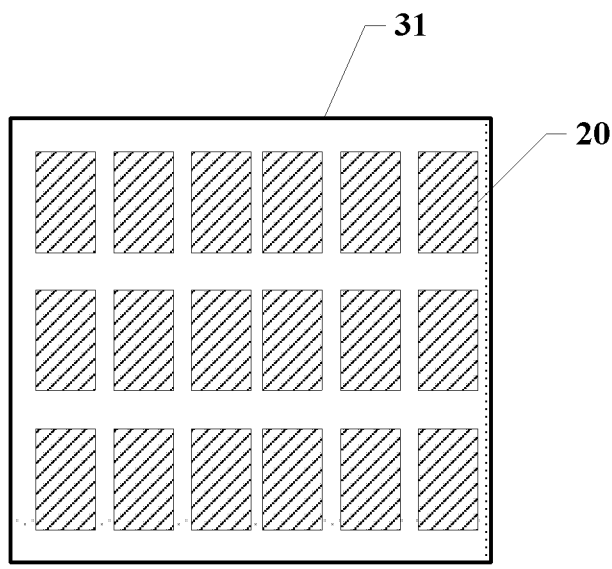
FIG. 4 illustrates a diagram showing a relative position relationship between first electrodes and sub-pixels in a display panel consistent with the disclosed embodiments of the present disclosure.

FIG. 2 illustrates an arrangement diagram of sub-pixels in a display panel consistent with the disclosed embodiments of the present disclosure. FIG. 3 illustrates an arrangement diagram of first electrodes in a display panel consistent with the disclosed embodiments of the present disclosure. FIG. 4 illustrates a diagram showing a relative position relationship between first electrodes and sub-pixels in a display panel consistent with the disclosed embodiments of the present disclosure. Referring to FIGS. 2-4, a display panel 100 provided by the present disclosure includes a display area 11 and a non-display area 12 surrounding the display area 11.

The display panel 100 also includes a base substrate 101, a plurality of sub-pixels 20 located in the display area 11 and arranged in a first direction and a second direction, a plurality of electrode rows 30 extending in the first direction and arranged in the second direction, a plurality of electrode columns 40 arranged in the first direction and extending in the second direction, a plurality of switch units 50 located in the display area 11, a plurality of first signal lines 41, a plurality of second signal lines 42, and a plurality of first driving circuits 60 located in the non-display area 12.

Each electrode row 30 and each electrode column 40 respectively include a plurality of first electrode 31. An orthographic projection of one first electrode 31 on a plane of the base substrate 101 covers at least two sub-pixels 20.

In one embodiment, as shown in FIG. 3, the display panel 100 includes four electrode rows 30 and four electrode columns 40. In one embodiment, as shown in FIG. 4, an orthographic projection of one first electrode 31 on the plane of the substrate 101 covers 18 sub-pixels 20 arranged in 3 rows and 6 columns.

As shown FIG. 3, each switch unit 50 includes at least one first switch 51, and one first electrode 31 is electrically connected to a first pole of at the least one first switch 51 of a corresponding switch unit 50. In one embodiment, as shown in FIG. 3, each of the first electrodes 31 corresponds to one switch unit 50, and one switch unit 50 includes one first switch 51.

Referring to FIG. 3, a same electrode column 40 corresponds to at least one first signal line 41, and a same first signal line 41 is electrically connected to a second pole of the at least one first switch 51 of the switch units 50 corresponding to the same electrode array 40. The at least one first signal line 41 corresponding to a same electrode column 40 is connected to a same first signal terminal 70, and the first signal lines 41 corresponding to different electrode columns 40 are connected to different first signal terminals 70. In one embodiment, as shown in FIG. 3, one electrode column 40 corresponds to one first signal line 41.

A same electrode row 30 corresponds to at least one second signal line 42, and a same second signal line 42 is electrically connected to a gate of the at least one first switch 51 in the switch unit 50 corresponding to the first electrode 31 in one same electrode row 30. In one embodiment, as shown in FIG. 3, one same electrode row 30 corresponds to one second signal line 42.

Each second signal line 42 corresponding to a same electrode row 30 is connected to at least one same first driving circuit 60. In one embodiment, as shown in FIG. 3, the second signal line 42 corresponding to a same electrode row 30 is electrically connected to one first driving circuit 60.

In a touch stage, the first driving circuit 60 supplies a driving signal to the second signal lines 42 corresponding to the electrode rows 30, such that the switch units 50 electrically connected to the second signal lines 42 are turned on. Accordingly, the first signal lines 41 may transmit a touch detection signal to the first electrodes 31 electrically connected to the switch units 50 that are turned-on.

It should be noted that, in some other embodiments of the present disclosure, the numbers of electrode rows 30 and electrode columns 40 included in the display panel 100 may be more, and the total number of corresponding first electrodes 31 may also be more. The present disclosure does not specifically limit the numbers of electrode rows 30 and electrode columns 40, and the total number of corresponding first electrodes 31.

Compared to the embodiment shown in FIG. 4, in some other embodiments, the numbers of rows and columns of sub-pixels 20 covered by an orthographic projection of a first electrode 31 on the plane of the base substrate 101 may be more or less. The number of sub-pixels covered by the orthographic projection of a first electrode 31 on the plane of the base substrate 101 may also be more or less. The numbers of rows and columns of the sub-pixels 20 covered by the orthographic projection of a first electrode 31 on the plane of the base substrate 101 may be set according to actual conditions, and are not specifically limited in the present disclosure.

In one embodiment, the orthographic projection of a first electrode 31 on the plane of the base substrate 101 covers at least two sub-pixels 20. That is, an orthographic projection of at least two sub-pixels 20 on the plane of the base substrate 101 falls within a range defined by the orthographic projection of the first electrode 31 on the plane of the base substrate 101. In some other embodiments, the number of the first switches 51 included in the switch unit 50 corresponding to the first electrode 31 may be two or more. The number of the first signal lines 41 corresponding to a same electrode column 40 may be two or more, and the number of the second signal lines 42 corresponding to a same electrode row 30 may also be two or more.

Specifically, with reference to FIGS. 2-4, in the display panel 100 provided by the present disclosure, an array of sub-pixels 20 and an array of first electrodes 31 are disposed in the display area 11. To clearly illustrate technical solutions of the present disclosure, the present disclosure separately illustrates the arrangement of the sub-pixels 20 in FIG. 2, and the arrangement of the first electrodes 31 in FIG. 3. The relative position relationship between the first electrode 31 and the sub-pixel 20 is illustrated in FIG. 4.

The present disclosure introduces the switch units 50 corresponding to the first electrodes 31 in the display area 11. Each switch unit 50 includes at least one first switch 51, and a first pole of the first switch 51 is electrically connected to the corresponding first electrode 31. A same first signal line 41 is electrically connected to a second pole of the at least one first switch 51 in the switch units 50 corresponding to a same electrode column 40. A same second signal line 42 is electrically connected to a gate of the at least one first switched 51 of the switch units 50 corresponding to the first electrodes 31 of a same electrode row 30.

In a touch stage, the first driving circuits 60 supplies a driving signal to the second signal lines 42 corresponding to the electrode rows 30, such that the switch units 50 electrically connected to the second signal lines 42 are turned on. Accordingly, the first signal lines 41 may transmit a touch detection signal to the first electrodes 31 electrically connected to the switch units 50 that are turned-on, and thus a normal touch detection function may be achieved.

In particular, in the present disclosure, the first signal line 41 corresponding to a same electrode column 40 is connected to a same first signal terminal 70. In a conventional technology, the first electrodes 31 corresponding to an electrode column 40 need to be respectively connected to different signal terminals. As such, the present disclosure may reduce the number of the first signal terminals 70 and reduces the total number of traces drawn from the first signal terminals 70. Accordingly, a frame width of the non-display area 12 of the display panel 100 may be reduced, and thus a narrow-frame design may be achieved.

In the present disclosure, the number of the first electrodes 31 included in each electrode column 40 is N, and there are M electrode columns 40 in total. The number of the first signal terminals 70 is same as the number of the corresponding electrode columns 40 in the display panel 100. That is, the number of the first signal terminals 70 is M. In a conventional technology, each first electrode needs to be electrically connected to one signal terminal, so the number of the signal terminals in a conventional technology should be M*N. Accordingly, compared to a conventional technology, the number of the first signal terminals 70 in the present disclosure may be reduced. Since the first signal terminals 70 are generally disposed on a driving chip, when the number of the first signal terminals 70 is reduced, a production cost of the driving chip may be reduced, and a narrow-frame design of the display panel 100 may also be realized.

Figure 5:
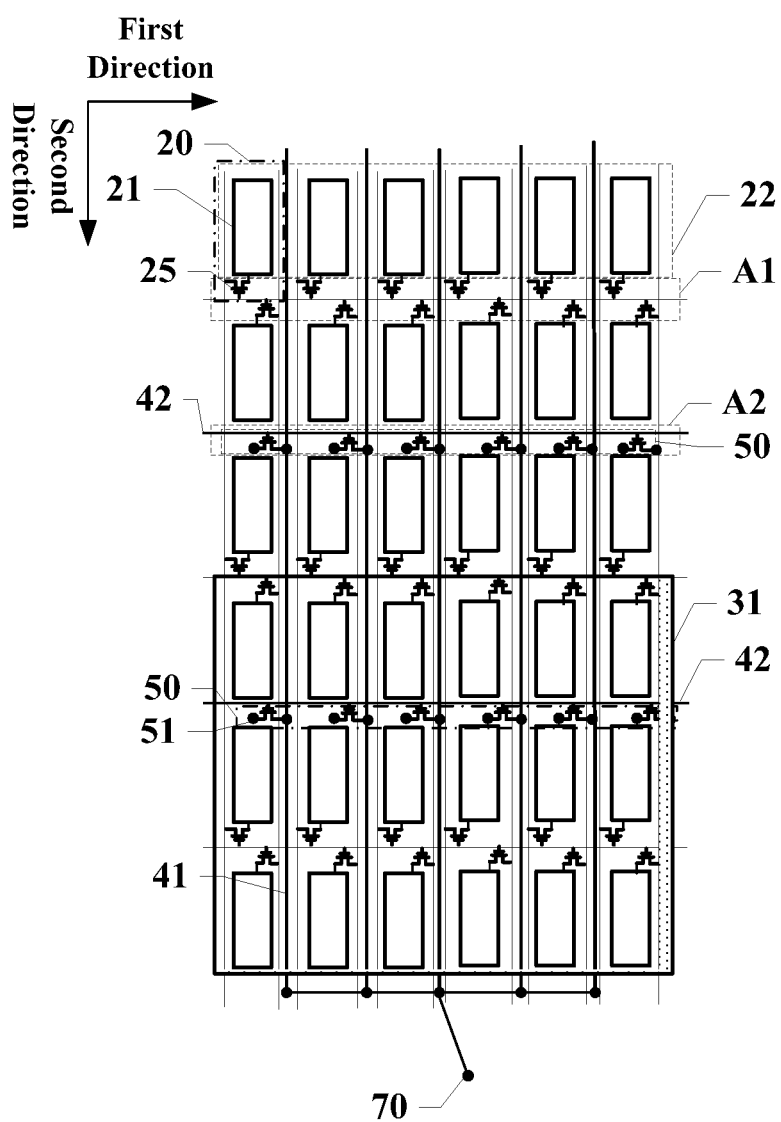
FIG. 5 illustrates a diagram showing a connection relationship between pixel electrodes and transistors in a display panel consistent with the disclosed embodiments of the present disclosure.

FIG. 5 illustrates a diagram showing a connection relationship between the pixel electrodes 21 and the transistors 25 in the display panel 100 consistent with the disclosed embodiments of the present disclosure. FIG. 5 also shows a relative position relationship between the first electrode 31 and the sub-pixels 20. As shown in FIG. 5, the sub-pixel 20 includes a pixel electrode 21 and a transistor 25 electrically connected to the pixel electrode 21 in one-to-one correspondence. A plurality of pixel electrodes 21 form a plurality of pixel electrode rows 22 extending in the first direction and arranged in the second direction. A spacing region is formed between any two adjacent pixel electrode rows 22. The spacing region extends in the first direction, and includes a first spacing region A1 and a second spacing region A2 arranged in the second direction.

The transistors 25 of two adjacent rows of sub-pixels 20 are located in a same first spacing region A1, and the switch units 50 are located in the second spacing regions A2.

Specifically, with continued reference to FIG. 5, the first spacing region area A1 and the second spacing region area A2 are formed between two adjacent pixel electrode rows 22. In the present disclosure, the transistors 25 electrically connected to the pixel electrodes 21 on two sides of the first spacing region A1 are simultaneously disposed in the first spacing region A1. The transistors electrically connected to the pixel electrodes 21 are not disposed in the second spacing region A2. A space for disposing the switch units 50 electrically connected to the first electrodes 31 is reserved in the second spacing region A2. This configuration may properly use the space of non-opening areas in the display area 11 of the display panel 100, and effectively reduce the influence on the aperture ratio of the display panel 100 after the switch units 50 are introduced into the display region 11.

Further, in the present disclosure, the transistors 25 electrically connected to the pixel electrodes 21 and the switch units 50 electrically connected to the first electrodes 31 are respectively disposed in the first spacing region A1 and the second spacing region A2. In a production process of the display panel 100, areas where circuits corresponding to the pixel electrodes 21 and circuits corresponding to the first electrodes 31 are located may be quickly distinguished. Accordingly, the production process of the display panel 100 may be simplified and the production efficiency of the display panel 100 may be improved.

In one embodiment, referring to FIG. 5, in a same switch unit 50, the at least one first switch 51 is disposed in a same second spacing region A2.

It should be noted that, to clearly illustrate difference between the first spacing region A1 and the second spacing region A2, and corresponding relationship between the first electrodes 31 and the sub-pixels 20, the first electrode 31 corresponding to the sub-pixels 20 is not illustrated in an upper part region of FIG. 5, and the first electrode 31 are illustrated only in a lower part region of FIG. 5.

In one embodiment, an orthographic projection of one first electrode 31 on the base substrate 101 covers three rows and six columns of the sub-pixels 20. Referring to a region corresponding to the first electrode 31 in FIG. 5, there is one switch unit 50 corresponding to the first electrode 31. The switch unit 50 includes six first switches 51, and the six first switches 51 are distributed in a same second spacing region A2. As such, one first electrode 31 is electrically connected to the six first switches 51. During a touch stage, the second signal line 42 sends a control signal to each of the first switches 51 of the switch unit 50, such that each of the first switches 51 electrically connected to the second signal line 42 is turned on. Accordingly, the first signal line 41 may transmit touch detection signals to the corresponding first electrode 31.

In the present disclosure, one first electrode 31 is electrically connected to six first switches 51 in the switch unit 50, and thus reliability of the electrical connection between the switch unit 50 and the first electrode 31 may be enhanced. Accordingly, the first electrode 31 may reliably receive the touch detection signal during a touch stage, and the touch reliability of the display panel 100 may thus be improved.

Figure 6:
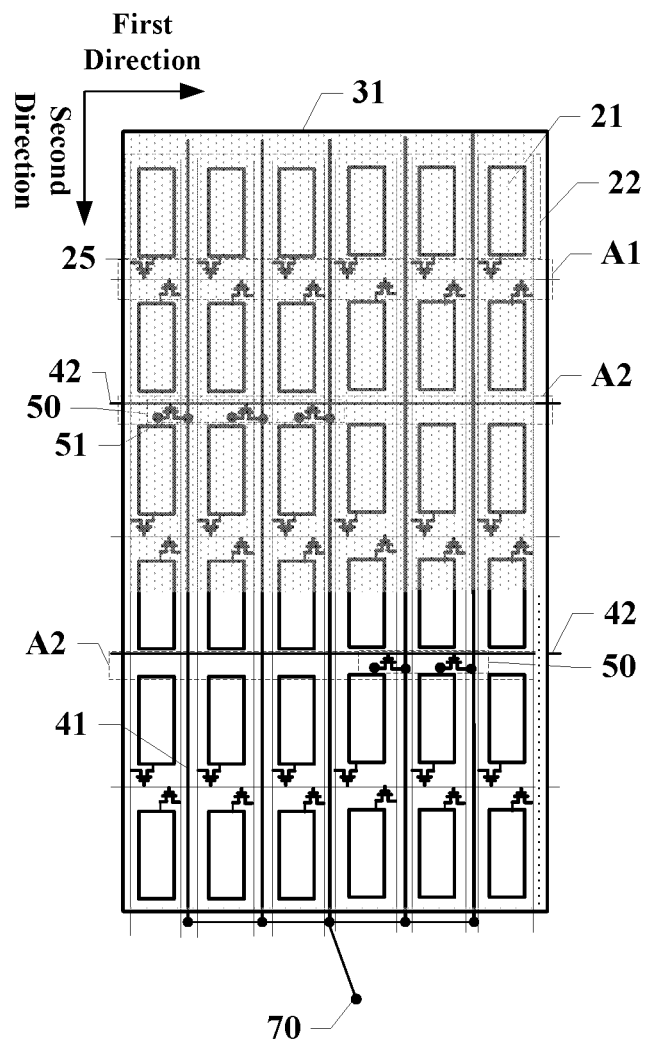
FIG. 6 illustrates a diagram showing another relative position relationship between first electrodes and sub-pixels in a display panel consistent with the disclosed embodiments of the present disclosure.

FIG. 6 illustrates a diagram showing another relative position relationship between the first electrodes 31 and the sub-pixels 20 in the display panel 100. In a same switch unit 50, the first switches 51 may be distributed in different second spacing regions A2.

Specifically, in one embodiment, as shown in FIG. 6, an orthographic projection of the first electrode 31 on the plane of the base substrate 101 covers 6 rows and 6 columns of sub-pixels 20, and correspondingly covers three first spacing regions A1 and two second spacing regions A2. The switch unit 50 corresponding to the first electrode 31 includes a plurality of first switches 51, and the first switches 51 are distributed in different second spacing regions A2. In such an arrangement, a space of the second spacing region A2 may be properly utilized, such that the distribution of the first switches 51 in a region corresponding to the first electrode 31 may be uniform. In addition, the first electrode 31 is electrically connected to a plurality of first switches 51 simultaneously, and thus reliability of the electrical connection between the switch unit 50 and the first electrode 31 may be enhanced. Accordingly, the first electrode 31 may reliably receive the touch detection signal during a touch stage, and the touch reliability of the display panel 100 may thus be improved.

It should be noted that FIG. 6 shows a case where the first switches 51 corresponding to a same first electrode 31 are distributed in two different second spacing regions A2. In some other embodiments of the present disclosure, the first switches 51 corresponding to a same first electrode 31 may also be distributed in three or more different second spacing regions A2, which are not specifically limited by the present disclosure.

When the first switches 51 corresponding to a same first electrode 31 are distributed in different second spacing regions A2, the numbers of the first switches 51 included in the different second spacing regions A2 may be different. Distribution positions of the switches 51 in the different second spacing area A2 may also be different. In one embodiment, as shown in FIG. 6, one second spacing area A2 includes three first switches 51, and the three first switches 51 are located at positions where the second spacing region A2 intersects with first, second and third pixel columns. The other second spacing region A2 includes two first switches 51, and the two first switches 51 are located at positions where the second spacing region A2 intersects the fourth and fifth pixel columns. That is, the five first switches 51 corresponding to a same first electrode 31 are electrically connected to different first signal lines 41 respectively. In a touch stage, different first signal lines 41 may respectively transmit a touch detection signal to the corresponding first switches 51, such that the same first electrode 31 may receive the touch detection signal transmitted by the five first switches 51. Even if some of the first signal lines 41 may fail, other first signal lines 41 may normally transmit the touch detection signal. Accordingly, reliability of the first electrode 31 in receiving touch detection signals may be ensured, and the touch reliability of the display panel may thus be improved.

In one embodiment, referring to FIG. 6, each of the second spacing regions A2 corresponding to a same switch unit 50 may respectively include a plurality of first switches 51.

Specifically, in one embodiment, with reference to FIG. 6, one switch unit 50 includes 10 first switches 51. Five first switches 51 are distributed in a same second spacing region A2, and the other five first switches 51 are distributed in another second spacing region A2. Since the first electrode 31 is simultaneously electrically connected to the 10 first switch 51, reliability of the electrical connection between the first electrode 31 and the switch unit 50 may be enhanced. As such, reliability of the first electrode 31 in receiving touch detection signals during a touch stage may be improved, and touch reliability of the display panel 100 may be improved.

In one embodiment, with continued reference to FIG. 6, each second spacing region A2 includes the first switch 51. It should be noted that FIG. 6 only shows a relative position relationship between one first electrode 31 and sub-pixels 20. Correspondingly, the relative position relationship between the plurality of first electrodes 31 and the sub-pixels 20 in the entire display panel 100 may be understood as a repeat arrangement on basis of FIG. 6. Since each second spacing region A2 is disposed with first switches 51, spaces of the second spacing regions A2 may be properly utilized, and different positions of a same first electrode 31 may be electrically connected to different first switches 51. Accordingly, reliability of the electrical connection between the first electrode 31 and the first switches 51 may be improved, and touch reliability of the display panel 100 may thus be improved.

Figure 7:
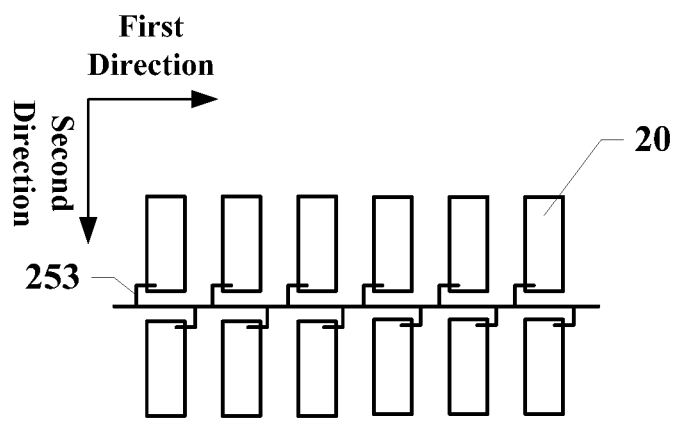
FIG. 7 illustrates a diagram showing a relative position relationship between channel regions of transistors and sub-pixels in a display panel consistent with the disclosed embodiments of the present disclosure.

FIG. 7 illustrates a diagram showing a relative position relationship between channel regions 253 of transistors 25 and the sub-pixels 20 in a display panel 100 consistent with the disclosed embodiments of the present disclosure. In one embodiment, as shown in FIGS. 5 and 7, the transistor 25 includes a channel region 253, and an orthographic projection of the channel region 253 on the plane of the base substrate 101 is L-shaped.

The transistor 25 may include a semiconductor active layer. The semiconductor active layer may be formed by means of changing amorphous silicon to polycrystalline silicon by crystallization of the amorphous silicon. The semiconductor active layer includes a source region and a drain region formed by doping with impurity ions. A region between the source region and the drain region is the channel region 253 in which no impurities are doped.

In the present disclosure, an orthographic projection of the channel region 253 of the transistor 25 on the plane of the base substrate 101 is set to be L-shaped. In two adjacent rows of sub-pixels 20, the channel regions 253 of the transistors 25 corresponding to the sub-pixels 20 located in an odd-numbered row are arranged in a uniform manner, and the channel regions 253 of the transistors 25 corresponding to the sub-pixels 20 located in an even-numbered row are arranged in another manner. At a viewing angle shown in FIG. 7, openings of the L-typed channel regions of the transistors 25 corresponding to sub-pixels 20 in an odd-numbered row face lower right, and openings of the L-typed channel regions of the transistors 25 corresponding to the sub-pixels 20 in an even-numbered row face upper left. With such an arrangement, arrangement spaces of the transistors 25 in the sub-pixels 20 on the display panel 100 may be saved. Accordingly, a space ratio of the transistors 25 in the sub-pixels 20 in the display region 11 may be reduced, and thus an aperture ratio of the display panel 100 may be increased.

Figure 8:
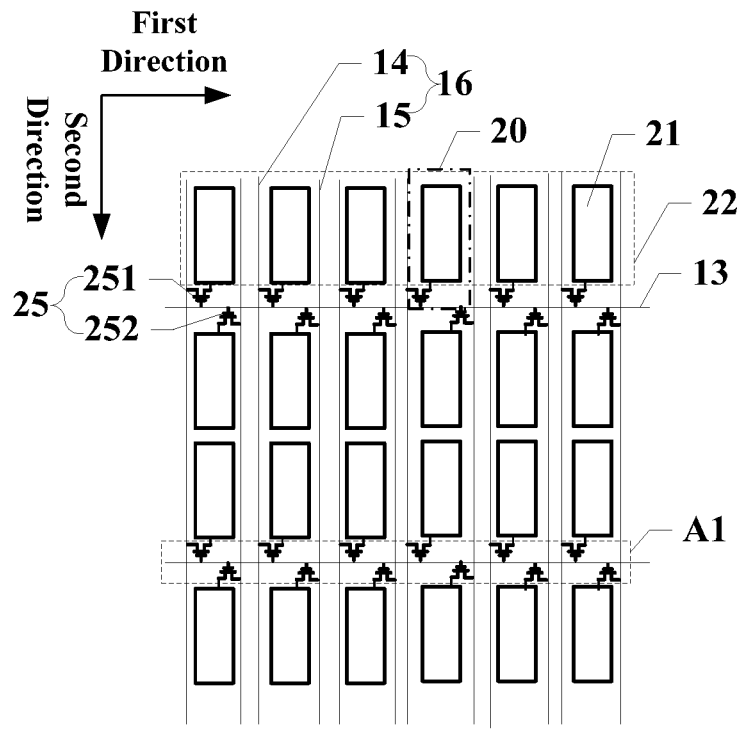
FIG. 8 illustrates a connection diagram of sub-pixels in a display panel consistent with the disclosed embodiments of the present disclosure.

FIG. 8 illustrates a connection diagram of sub-pixels in a display panel 100 consistent with the disclosed embodiments of the present disclosure. In one embodiment, as shown in FIG. 8, the display panel 100 also includes a plurality of gate lines 13 extending in the first direction and arranged in the second direction, and a plurality of data lines 16 arranged in the first direction and extending in the second direction.

A same first spacing region A1 includes one gate line 13, and a same gate line 13 may simultaneously supply a scan signal to the sub-pixels 20 in an odd-numbered row and an even-numbered row.

The data line 16 includes a first data line 14 and a second data line 15. In a same column of sub-pixels 20, the first data line 14 is electrically connected to the sub-pixels 20 in odd-numbered rows, and the second data line 15 is electrically connected to the sub-pixels 20 in even-numbered rows.

Specifically, referring to FIG. 8, gates of the transistors 25 corresponding to two adjacent rows of sub-pixels are connected to a same gate line 13, and the two rows of sub-pixels 20 are simultaneously controlled by the same gate line 13. The sub-pixels 20 of a same column correspond to two data lines. The first data line 14 is electrically connected to the sub-pixels 20 in odd-numbered rows, and the second data line 15 is electrically connected to the sub-pixels 20 in even-numbered rows. In a display process, a control signal is sequentially sent to the gate lines 13 on the display panel, such that the transistors 25 electrically connected to the gate lines 13 are turned on. At this time, the first data lines 14 and the second data lines 15 respectively transmit data signals to the sub-pixels 20 electrically connected to the transistors 25 that are turned-on, such that the two rows of sub-pixels 20 may be simultaneously in a display stage. In this connection mode, two rows of sub-pixels 20 may be scanned at a time. Accordingly, scanning efficiency of the display panel 100 may be improved compared to a conventional row-by-row scanning mode. In addition, in this mode, two rows of sub-pixels 20 may be controlled by one gate line 13, and thus the number of gate lines 13 in the display panel 100 may be reduced. Accordingly, the space ratio of the gate lines 13 in the display area 11 may be reduced, and thus the aperture ratio of the display panel 100 may be increased.

FIG. 8 illustrates a connection relationship between the transistors 25 and the pixel electrodes 21 when a same gate line 13 simultaneously provides a scan signal to the sub-pixels 20 of an odd-numbered row and an even-numbered row, respectively. As shown in FIG. 8, the transistor 25 includes a first transistor 251 and a second transistor 252. The first transistor 251 is electrically connected to the pixel electrode 21 of the odd-numbered row, and the second transistor 252 is electrically connected to the pixel electrodes 21 of the even-numbered row.

In the sub-pixels 20 of two adjacent odd-numbered row and even-numbered row, gates of the first transistors 251 and the second transistors 252 are connected to a same gate line 13. First poles of the first transistors 251 and the second transistors 252 are electrically connected to the pixel electrodes 21 in one-to-one correspondence. In the sub-pixels of a same column, second poles of first transistors 251 are connected to a same first data line 14, and second poles of second transistors 252 are connected to a same second data line 15.

With continued reference to FIG. 8, in a display process, a control signal is sequentially transmitted to the gate lines 13, and the gate lines 13 transmit the control signal to the first transistors 251 and the second transistors 252 electrically connected to the gate lines 13. The first transistors 251 and the second transistors 252 are then turned on, such that the first data lines 14 are electrically connected to the pixel electrodes 21 of odd-numbered rows, and the second data lines 15 are electrically connected to the pixel electrodes 21 of even-numbered rows. Thus, data signals may be transmitted to the pixel electrodes 21 of the odd-numbered rows through the first data lines 14, and meanwhile data signals may be transmitted to the pixel electrodes 21 of the even-numbered rows through the second data lines 15. Accordingly, the sub-pixels 20 of the adjacent odd-numbered row and even-numbered row may simultaneously perform a display function. Compared to scanning only one row of sub-pixels 20 at a time, simultaneously scanning two rows of sub-pixels 20 may improve scanning efficiency of the display panel 100.

It should be noted that, in the present disclosure, the second signal lines 42 may be fabricated in a same production process with the gate lines 13 without separately setting a new production process for introduction of the second signal lines 42. As such, a production process of the display panel 100 may be simplified, and production efficiency of the display panel 100 may be improved.

Figure 9:
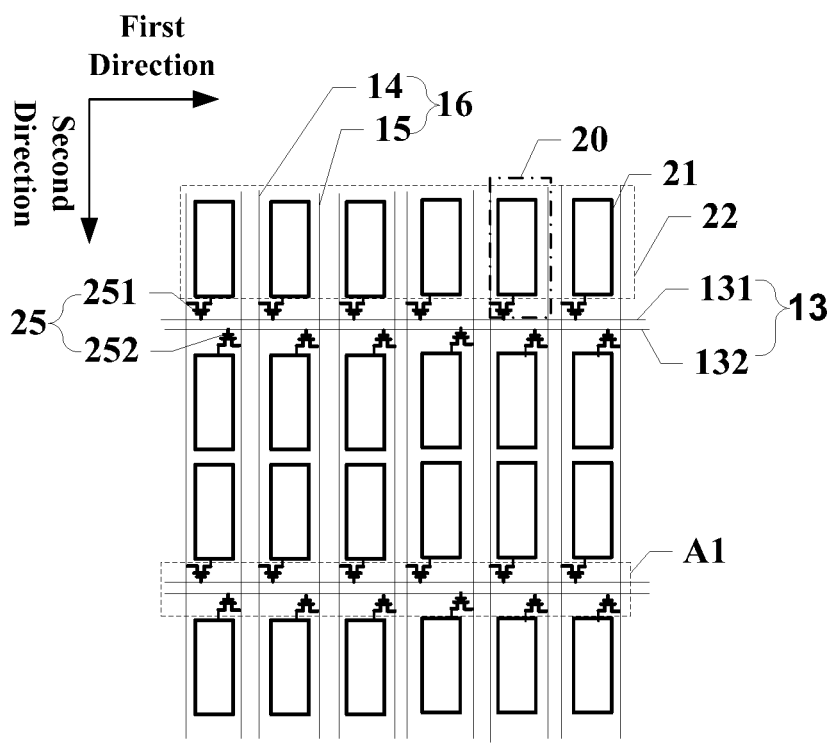
FIG. 9 illustrates another connection diagram of sub-pixels in a display panel consistent with the disclosed embodiments of the present disclosure.

FIG. 9 illustrates another connection diagram of sub-pixels 20 in a display panel 100 consistent with the disclosed embodiments of the present disclosure. The display panel 100 also includes a plurality of gate lines 13 extending in the first direction and arranged in the second direction, and a plurality of data lines 16 arranged in the first direction and extending in the second direction.

The gate line 13 includes a first gate line 131 and a second gate line 132. The first gate line 131 supplies a scan signal to the sub-pixels 20 in an odd-numbered row, and the second gate line 132 provides a scan signal to the sub-pixels 20 in an even-numbered row. The first gate line 131 and the second gate line 132 corresponding to two adjacent rows of sub-pixels 20 are located in a same first spacing region A1.

The data line 16 includes a first data line 14 and a second data line 15. In a same sub-pixel column, the first data line 14 is electrically connected to the sub-pixels 20 in odd-numbered rows, and the second data line 15 is electrically connected to the sub-pixels 20 in even-numbered rows.

Specifically, with continued reference to FIG. 9, in one embodiment, two gate lines 13 are simultaneously disposed in the first spacing region A1, including a first gate line 131 and a second gate line 132, respectively. The first gate line 131 is configured to provide a scan signal to sub-pixels 20 in an odd-numbered row, and the second gate line 132 is configured to supply a scan signal to the sub-pixels 20 in an even-numbered row. In a display process, a control signal is first provided to the first gate line 131, and data signals are supplied to the sub-pixels 20 in the odd-numbered row through the first data line 14, such that the sub-pixels 20 in the odd-numbered row may perform a display function. A control signal is then supplied to the second gate line 132 in a same first spacing region A1 where the first gate line 131 described above is located, such that the sub-pixels 20 in an even-numbered row may perform the display function. In this manner, the sub-pixels 20 on the display panel 100 are sequentially scanned row by row. Even if a circuit structure in the display panel 100 may change, the scanning mode may remain unchanged. As such, while changing the circuit structure of the display panel 100 to achieve a narrow frame, a normal display function may be realized without changing a driving flow of the display panel 100.

FIG. 9 also shows a connection relationship between the transistors 25 and the pixel electrodes 21 when the scan signal is supplied to the sub-pixels 20 of the odd-numbered rows and the even-numbered rows by the two gate lines 13, respectively. The transistor 25 includes a first transistor 251 and a second transistor 252. The first transistors 251 are electrically connected to the pixel electrodes 21 at an odd-numbered row, and the second transistors 252 are electrically connected to the pixel electrodes 21 at an even-numbered row.

In the sub-pixels 20 of an odd-numbered row, gates of the first transistors 251 are connected to a same first gate line 131. In the sub-pixels 20 of an even-numbered row, gates of the second transistors 252 are connected to a same second gate line 132. First poles of the first transistors 251 and the second transistors 252 are electrically connected to the pixel electrodes 21 in one-to-one correspondence. In the sub-pixels 20 of a same column, the second poles of the first transistors 251 are connected to a same first data line 14, and the second poles of the second transistors 252 are connected to a same second data line 15.

Specifically, with continued reference to FIG. 9, two gate lines 13 are simultaneously disposed in a first spacing region A1. The first gate line 131 are electrically connected to the gates of the first transistors 251 corresponding to the pixel electrodes 21 in an odd-numbered row. The second gate line 132 is electrically connected to the gates of the second transistors 252 corresponding to the pixel electrodes 21 in an even-numbered row. In a display process, for two adjacent rows of sub-pixels 20, a control signal is first sent to the first gate line 131, such that the first transistors 251 electrically connected to the first gate line 131 are turned on. As such, the first data line 14 is electrically connected to the pixel electrodes 21 in the odd-numbered row. Accordingly, data signals may be transmitted to the pixel electrodes 21 in the odd-numbered row through the first data line 14, such that the sub-pixels 20 of the odd-numbered row may perform the display function. Secondly, a control signal is sent to the second gate line 132, such that the second transistors 252 electrically connected to the second gate line 132 are turned on, and thus the second data line 15 is electrically connected to the pixel electrodes 21 in the even-numbered row. Accordingly, the second data line 15 may transmit data signals to the pixel electrodes 21 in the even-numbered row such that the sub-pixels 20 in the even-numbered row may perform the display function. In this way, in a display of process of the display panel 100, a row-by-row scan display function for the sub-pixels 20 may be realized.

It should be noted that, the second signal lines 42 may be disposed in a same production process with the first gate lines 131 and the second gate lines 132. It is not necessary to separately set a new production flow for introduction of the second signal lines 42. Accordingly, the production process of the display panel 100 may be simplified and the production efficiency of the display panel 100 may be improved.

Figure 10:
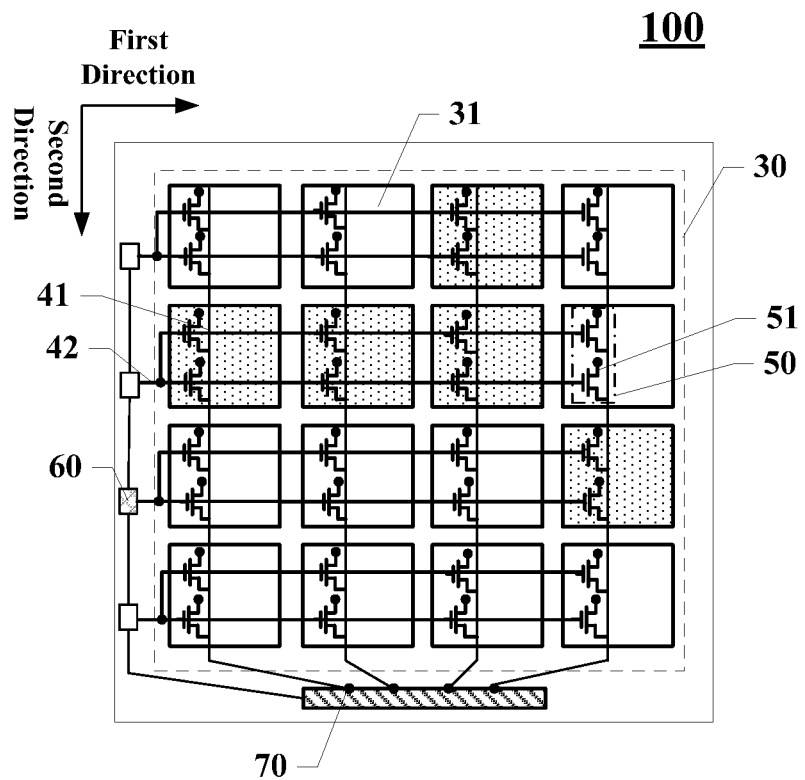
FIG. 10 illustrates another arrangement diagram of first electrodes in a display panel consistent with the disclosed embodiments of the present disclosure.

FIG. 10 illustrates another arrangement diagram of first electrodes 31 in a display panel 100 consistent with the disclosed embodiments of the present disclosure. In one embodiment, as shown in FIG. 10, a same switch unit 50 includes a plurality of first switches 51, and a same electrode column 40 corresponds to one first signal line 41.

In a same switch unit 50, the first poles of the first switches 51 are connected to a same first signal line 41, and control terminals of the first switches 51 are connected to different second signal lines 42. The second poles of the first switches 51 are electrically connected to a same first electrode 31, respectively.

Specifically, with continued reference to FIG. 10, in one embodiment, one switch unit 50 including two first switches 51. In a same switch unit 50, the two first switches 51 are arranged in the second direction. In a same electrode column 40, second poles of the first switches 51 are connected to a same first signal line 41. A same electrode row 30 corresponds to two second signal lines 42. The two second signal lines 42 corresponding to a same electrode row 30 are connected to a same first driving circuit 60. In this way, each electrode column 40 is electrically connected to a first signal terminal 70 through only one first signal line 41, such that wiring complexity of the display panel 100 may be simplified and production efficiency of the display panel 100 may be improved. In addition, each first electrodes 31 is electrically connected to two first switches 51. Accordingly, reliability of the electrical connection between the first electrode 31 and the switch unit 50 may be improved, and thus touch reliability of the display panel 100 may be improved.

Figure 11:
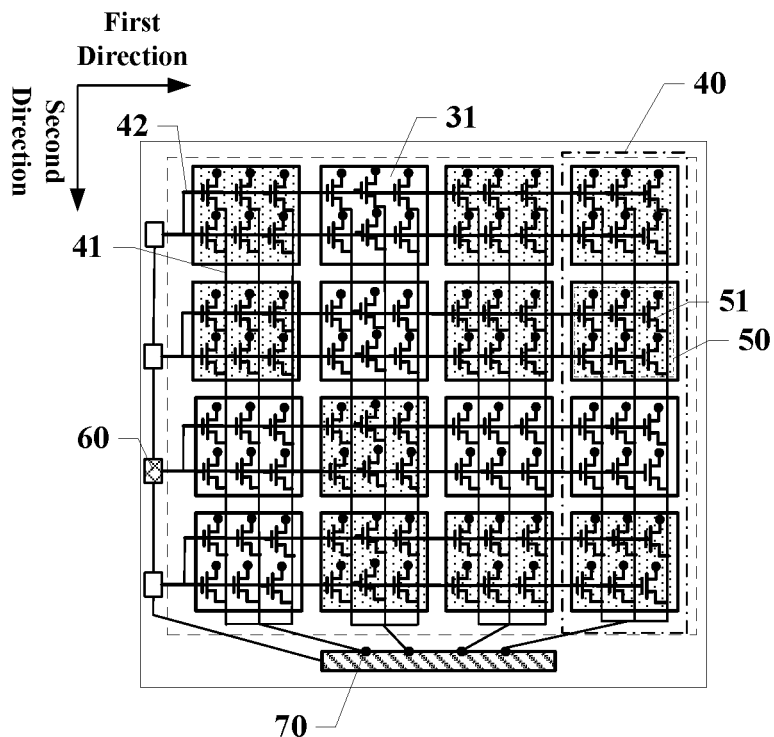
FIG. 11 illustrates another layout diagram of first electrodes in a display panel consistent with the disclosed embodiments of the present disclosure.

FIG. 11 illustrates another arrangement diagram of first electrodes 31 in a display panel 100 consistent with the disclosed embodiments of the present disclosure. As shown in FIG. 11, a same switch unit 50 includes a plurality of first switches 51, and a same electrode column 40 corresponding to n first signal lines 41, where n≥2.

In a same switch unit 50, a plurality of first switches 51 form m switch columns, where m=n. The switch columns are arranged in the first direction, and each switch column includes at least one first switch 51. First poles of the first switches 51 at a same switch column are connected to a same first signal line 41, and the first switches 51 at different switch columns are connected to different first signal lines 41. In a same switch unit 50, control terminals of the first switches 51 are connected to at least one same first driving circuit 60, and second poles of the first switches 51 are electrically connected to a same first electrode 31 respectively. The first signal lines 41 corresponding to a same electrode column 40 are connected to a same first signal terminal 70.

Specifically, with reference to FIG. 11, in one embodiment, a switch unit 50 includes six first switches 51, and m=n=3. The six first switches 51 of the switch unit 50 form two rows and three columns. First poles of the first switches 51 located in a same switch column are connected to a same first signal line 41. The six first switches 51 are electrically connected to a same first electrode 31 at same time. Accordingly, reliability of the electrical connection between the switch unit 50 and the first electrode 31 may be improved, and thus reliability of the touch function of the display panel 100 may be improved. In addition, in a touch stage, when a same electrode column 40 corresponds to a plurality of first signal lines 41, the plurality of first signal lines 41 may simultaneously transmit a touch detection signal to the same first electrode 31. Accordingly, the reliability of the display panel 100 for receiving the touch detection signal may be improved, and thus the touch reliability of the display panel 100 may be also improved.

In addition, in the present disclosure, the first signal lines 41 corresponding to a same electrode column 40 are connected to a same first signal terminal 70. In a conventional technology, the first electrodes 31 corresponding to one electrode column 40 need to be respectively connected to different signal terminals. The present disclosure may effectively reduce the number of the first signal terminals 70 and reduces the total number of traces drawn from the first signal terminals 70. Accordingly, a frame width of the non-display area 12 of the display panel 100 may be decreased, and a narrow-frame design may be achieved.

In one embodiment, as shown in FIG. 11, second signal lines 42 corresponding to a same electrode row are electrically connected to a same first driving circuit 60. The first driving circuits 60 are located on a same side of the display area 11 in the first direction. Specifically, a same electrode row 30 corresponds to a first driving circuit 60, and the first driving circuits 60 are located in the non-display area 12 on a same side of the display area 11. During a touch stage, the first driving circuits 60 may provide a control signal to the electrode rows 30 row by row, such that each electrode row 30 may receive the touch detection signal row by row.

Figure 12:
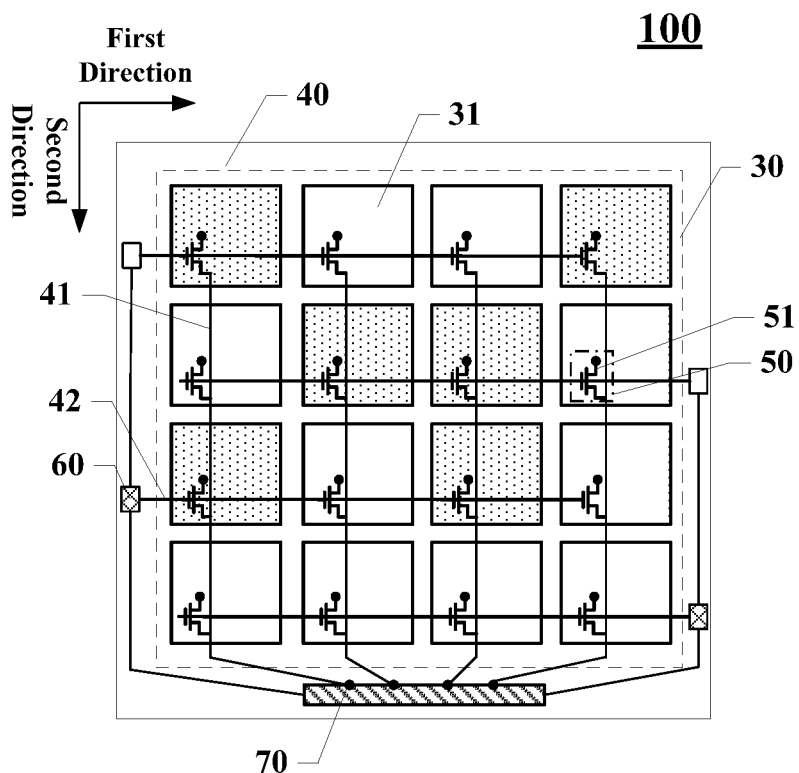
FIG. 12 illustrates another layout diagram of first electrodes in a display panel consistent with the disclosed embodiments of the present disclosure.

FIG. 12 illustrates another arrangement diagram of first electrodes 31 in a display panel 100 consistent with the disclosed embodiments of the present disclosure. In one embodiment, as shown in FIG. 12, the first driving circuits 60 electrically connected to the second signal lines 42 corresponding to two adjacent electrode rows 30 are respectively located on two opposite sides of the display area 11 in the first direction.

Specifically, as shown in FIG. 12, a same electrode row 30 corresponds to a first driving circuit 60, and the first driving circuits 60 are alternately distributed on two opposite sides of the display region 11 in the first direction. In this way, the first driving circuits 60 are uniformly distributed in the non-display area 12 on two sides of the display area 11, and the non-display area 12 on the two opposite sides of the display area 11 in the first direction may be properly utilized.

Figure 13:
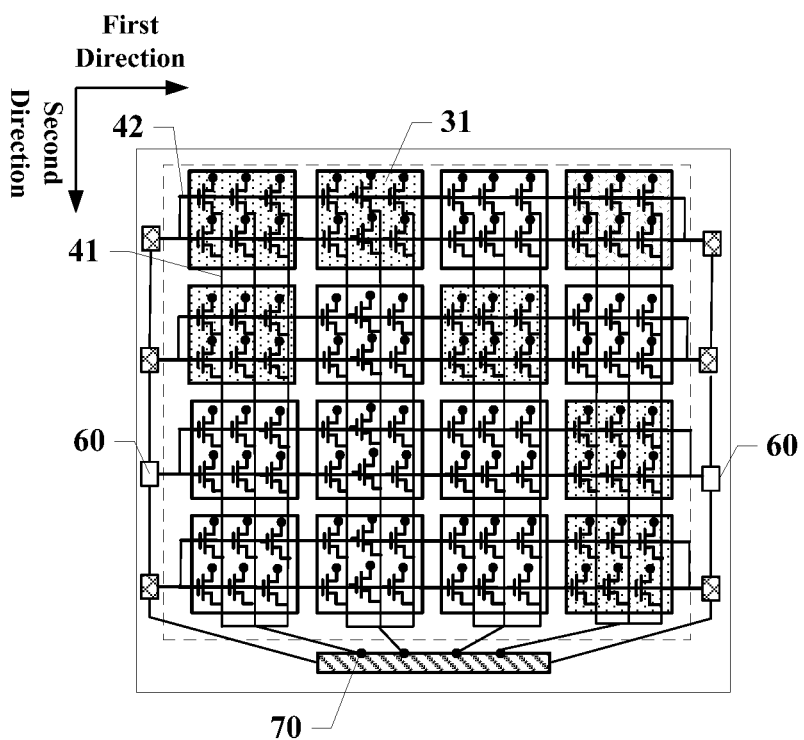
FIG. 13 illustrates another layout diagram of first electrodes in a display panel consistent with the disclosed embodiments of the present disclosure.

FIG. 13 illustrates another arrangement diagram of first electrodes 31 in a display panel 100 consistent with the disclosed embodiments of the present disclosure. In one embodiment, as shown in FIG. 13, the second signal lines 42 corresponding to a same electrode row 30 are simultaneously electrically connected to two first driving circuits 60. The two first driving circuits 60 electrically connected to the second signal lines 42 corresponding to the same electrode row 30 are respectively located at two opposite sides of the display area 11 in the first direction.

Specifically, as shown in FIG. 13, the second signal lines 42 corresponding to a same electrode row 30 are simultaneously electrically connected to two first driving circuits 60. In a touch stage, the two first driving circuits 60 corresponding to the same electrode row 30 simultaneously send a control signal to the second signal lines 42 in the same electrode row 30, such that each first switched 51 electrically connected to each second signal line 42 in the electrode row 30 is turned on. Accordingly, the first signal lines 41 corresponding to the first electrodes 31 in the electrode row 30 may transmit a touch detection signal to each first electrode 31 in the electrode row 30. Since the first switches 51 in the same electrode row 30 may be simultaneously driven by the two first driving circuits 60, driving reliability of each first switch 51 may be improved. That is, each first switch 51 may be reliably turned on after receiving the control signal sent from the first driving circuits 60, and the touch reliability of the display panel 100 may be improved.

It should be noted that, in a touch stage, when the electrode rows 30 are driven by the first driving circuits 60, the electrode rows 30 may be driven row-by-row from top to bottom, or may be driven row-by-row from bottom to top.

The electrode rows 30 may also be driven in other sequences. The present disclosure does not specifically limit driving sequences.

The present disclosure also provides a driving method for a display panel 100. The driving method may be used for driving the display panel 100 in the above embodiments of the present disclosure.

The driving methods includes a driving method for a touch stage. In the touch stage, with reference to FIG. 3, the first driving circuit 60 provides a driving signal to the second signal line 42 corresponding to an electrode row 30, such that the switch units 50 electrically connected to the second signal line 42 are turned on. The signal line 41 then transmits a touch detection signal to the first electrode 31 electrically connected to the switch units 50 that are turned-on. In this manner, in the touch stage, the first switches 51 of the switch units 50 corresponding to the electrode rows 30 are sequentially turned on, and the electrode rows 30 sequentially receive the touch detection signal transmitted by the first signal lines 41. When the first electrode 31 senses an external touch operation, a touch sensing signal may be transmitted to the first signal terminal 70 through the first signal line 41, and thus a touch detection function of the display panel 100 may be performed.

In particular, in the present disclosure, the first signal line 41 corresponding to a same electrode column 40 is connected to a same first signal terminal 70. In a conventional technology, the first electrodes 31 corresponding to one electrode column 40 need to be respectively connected to different signal terminals. The present disclosure may effectively reduce the number of the first signal terminals 70 and reduces the total number of traces drawn from the first signal terminals 70. Accordingly, a frame width of the non-display area 12 of the display panel 100 may be decreased, and a narrow-frame design may be achieved.

In one embodiment, with reference to FIG. 8, a sub-pixel 20 includes a pixel electrode 21 and a transistor 25 electrically connected to the pixel electrode 21 in one-to-one correspondence. The transistor 25 includes a first transistor 251 and a second transistor 252. The first transistor 251 is electrically connected to the pixel electrode 21 of an odd-numbered row, and the second transistor 252 is electrically connected to the pixel electrode 21 of an even-numbered row.

The display panel 100 also includes a plurality of gate lines 13 extending in the first direction and arranged in the second direction, and a plurality of data lines 16 arranged in the first direction and extending in the second direction. A same gate line 13 may simultaneously supply a scan signal to the sub-pixels 20 of an odd-numbered row and an even-numbered row, respectively. The data lines include a first data line 14 and a second data line 15. In a same column of sub-pixels, the first data line 14 is electrically connected to sub-pixels 20 in odd-numbered rows, and the second data line 15 is electrically connected to sub-pixels 20 in even-numbered rows.

The driving method also includes a driving method for a display stage. In the display stage, a control signal may be sequentially transmitted to the gate lines 13, such that the first transistors 251 electrically connected to the pixel electrodes 21 of an odd-numbered row corresponding to the gate line 13 and the second transistor 252 electrically connected to the pixel electrode 21 of an even-numbered row corresponding to the gate line 13 may be simultaneously turned on. Accordingly, data signals may be transmitted to the pixel electrodes 21 located in the odd-numbered row through the first data line 14, and meanwhile data signals may be transmitted to the pixel electrodes 21 located in the even-numbered row through the second data line 15.

Specifically, with continued reference to FIG. 8, in the display process, a control signal may be sequentially transmitted to the gate lines 13, and the gate lines 13 may transmit the control signal to the first transistors 251 and the second transistor 252 electrically connected to the gate lines. The first transistors 251 and the second transistors 252 are turned on, such that the first data lines 14 are electrically connected with the pixel electrodes 21 of odd-numbered rows, and the second data lines 15 are electrically connected with the pixel electrodes 21 of even-numbered rows. As such, data signals may be transmitted to the pixel electrode 21 at the odd-numbered rows through the first data lines 14, and in the meantime, data signals may be transmitted to the pixel electrodes 21 at the even-numbered rows through the second data lines 15. Accordingly, the sub-pixels 20 of adjacent odd-numbered row and even-numbered row may simultaneously perform a display function. In addition, compared to scanning only one row of sub-pixels 20 at a time, simultaneously scanning two rows of sub-pixels 20 in the present disclosure may improve scanning efficiency of the display panel 100.

In one embodiment, with reference to FIG. 9, a sub-pixel 20 includes a pixel electrode 21 and a transistor 25 electrically connected in one-to-one correspondence with the pixel electrode 21. The transistor 25 includes a first transistor 251 and a second transistor 252. The first transistor 251 is electrically connected to a pixel electrode 21 at an odd-numbered row, and the second transistor 252 is electrically connected to a pixel electrode 21 at an even-numbered row.

The display panel 100 also includes a plurality of gate lines 13 extending in the first direction and arranged in the second direction, and a plurality of data lines 16 arranged in the first direction and extending in the second direction. The gate lines 13 include a first gate line 131 and a second gate line 132, and the data lines include a first data line 14 and a second data line 15.

The driving method also includes a driving method for a display stage. In the display stage, a control signal is alternately transmitted to the first gate lines 131 and the second gate lines 132, such that the first transistors 251 electrically connected to the pixel electrodes 21 at an odd-numbered row and the second transistors 252 electrically connected to the pixel electrodes 21 at an even-numbered row are alternately turned on. Data signals are transmitted to the pixel electrodes 21 located in the odd-numbered rows through the first data line 14, and the data signals are transmitted to the pixel electrodes 21 located in the even-numbered rows through the second data line 15.

Specifically, with reference to FIG. 9, in the display process, for two adjacent rows of sub-pixels 20, a control signal is first sent to the first gate line 131, such that the first transistors 251 electrically connected to the first gate line 131 are turned on, and thus the first data line 14 is electrically connected to the pixel electrode 21 of the odd-numbered row. Accordingly, data signals may be transmitted to the pixel electrode 21 of the odd-numbered row through the first data line 14, such that the sub-pixel 20 of the odd-numbered row may perform a display function. Secondly, a control signal is sent to the second gate line 132, such that the second transistors 252 electrically connected to the second gate line 132 are turned on, and the second data line 15 is electrically connected with the pixel electrodes 21 at the even-numbered row. Accordingly, data signals may be transmitted to the pixel electrode 21 at the even-numbered row through the second data line 15, such that the sub-pixel 20 at the even-numbered row may perform the display function. In this way, a row-by-row scanning function for the sub-pixels 20 may be realized during the display process of the display panel 100.

Figure 14:
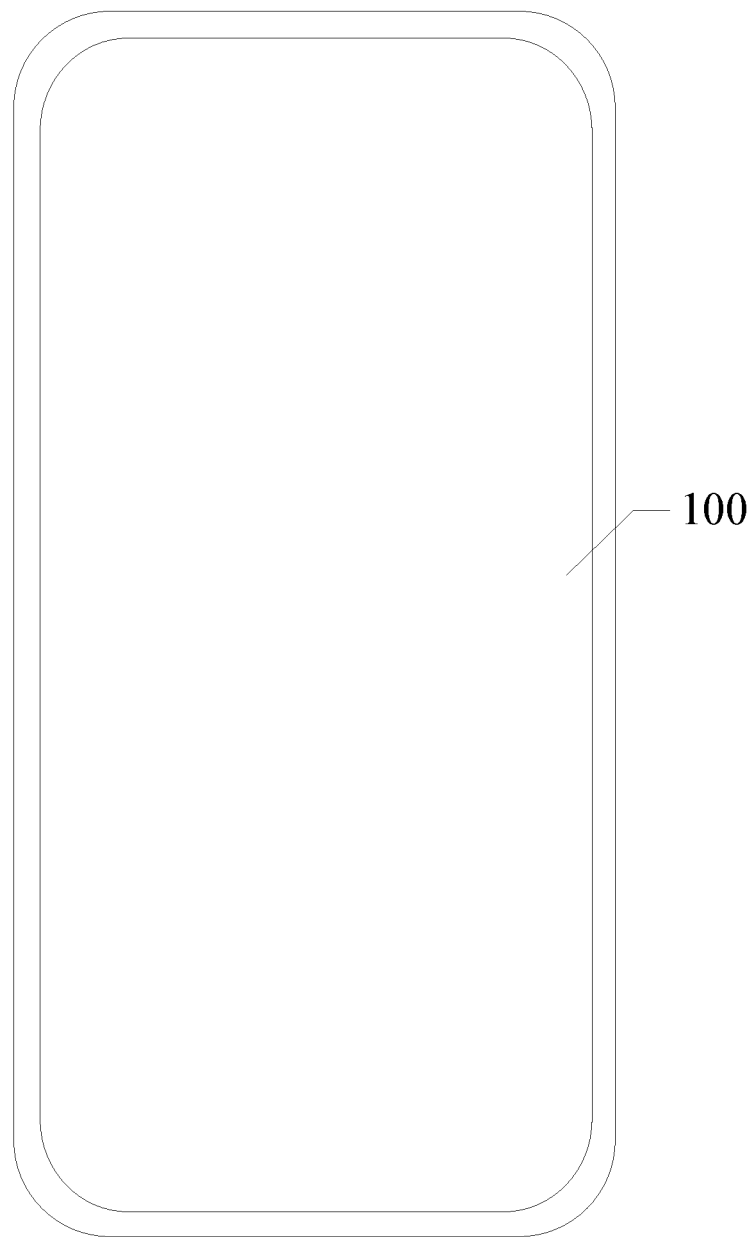
FIG. 14 illustrates a structural diagram of a touch display device consistent with the disclosed embodiments of the present disclosure.

The present disclosure also provides a touch display device 300. FIG. 14 illustrates a structural diagram of a touch display device consistent with the disclosed embodiments of the present disclosure. As shown in FIG. 14, the touch display device 300 includes a display panel 100 provided by the present disclosure. For implementation of the touch display device 300 provided by the present disclosure, reference may be made to the embodiments of the display panel 100. The touch display device 300 provided by the present disclosure may be any product or component having a display function, such as a mobile phone, a tablet computer, a television, a monitor, a notebook computer, a digital photo frame, a car navigation device, and the like.

As disclosed, the technical solutions of the present disclosure have the following advantages.

In the display panel, the driving method and the touch display device provided by the present disclosure, a switch unit electrically connected to a first electrode is introduced in a display area. In electrode columns, a same first signal line is electrically connected to at least one first switch of a switch unit corresponding to a first electrode in a same electrode column. In electrode rows, a same second signal line is electrically connected to a gate of at least one first switch of a switch unit corresponding to a first electrode in a same electrode row. In a touch stage, the first driving circuit provides a driving signal to the second signal lines, such that the switch units electrically connected to the second signal lines are turned on. The first signal lines transmit touch detection signals to the first electrodes electrically connected to the switch units that are turned-on, and a normal touch detection function is thus realized. In particular, in the present disclosure, the first signal line corresponding to a same electrode column is connected to a same first signal terminal. In a conventional technology, the first electrodes in an electrode column need to be connected to different signal terminals respectively. The present disclosure may effectively reduce the number of the first signal terminals, and may reduce the total number of traces drawn from the first signal terminals. Accordingly, a frame width of a non-display area of the display panel and the display device may be decreased, and thus a narrow-frame design may be realized.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A display panel, comprising:
    a display area;
    a non-display area surrounding the display area;
    a base substrate;
    a plurality of sub-pixels located in the display area and arranged in a first direction and a second direction intersecting the first direction, wherein:
        the plurality of sub-pixels include a pixel electrode and a transistor electrically connected to the pixel electrode in one-to-one correspondence, and a plurality of pixel electrodes form a plurality of pixel electrode rows extending in the first direction and arranged in the second direction;

a spacing region is formed between any two adjacent pixel electrode rows of the plurality of pixel electrode rows, the spacing region extends in the first direction, and includes a first spacing region and a second spacing region arranged in the second direction; and a plurality of transistors of two adjacent rows of sub-pixels are located in a same first spacing region;

a plurality of touch electrode rows extending in the first direction and arranged in the second direction, and a plurality of touch electrode columns arranged in the first direction and extending in the second direction, wherein each touch electrode row and each touch electrode column respectively include a plurality of first touch electrodes, and an orthographic projection of one first touch electrode of the plurality of first touch electrodes on a plane of the base substrate covers at least two sub-pixels;

a plurality of touch switch units located in the second spacing regions, wherein each touch switch unit includes at least one first touch switch, and one first touch electrode is electrically connected to a first pole of the at least one first touch switch of a corresponding touch switch unit of the plurality of touch switch units;

a plurality of first touch signal lines, wherein a same touch electrode column of the plurality of touch electrode columns corresponds to at least one first touch signal line, and a same first touch signal line of the plurality of first touch signal lines is electrically connected to a second pole of the at least one first touch switch of a touch switch unit corresponding to the same touch electrode column, wherein each touch electrode column has at least two first touch electrodes of the plurality of first touch electrodes connecting with a same first touch signal lines of the plurality of first touch signal lines, the at least one first touch signal line corresponding to the same touch electrode column is connected to a same first signal terminal, and the plurality of first touch signal lines corresponding to different touch electrode columns of the plurality of touch electrode columns are connected to different first signal terminals;

a plurality of second touch signal lines, wherein a same touch electrode row of the plurality of touch electrode rows corresponds to at least one second touch signal line, and a same second touch signal line of the plurality of second touch signal lines is electrically connected to a gate of the at least one first touch switch of a touch switch unit corresponding to one first touch electrode of the plurality of first touch electrodes in the same touch electrode row; and a plurality of driving circuits located in the non-display area, wherein each second touch signal line of the plurality of second touch signal lines corresponding to a same touch electrode row of the plurality of touch electrode rows is connected to at least a same driving circuit of the plurality of driving circuits, wherein:

in a touch stage, the plurality of driving circuits supply a driving signal to the plurality of second touch signal lines corresponding to the plurality of touch electrode rows, such that the plurality of touch switch units electrically connected to the plurality of second touch signal lines are turned on; and the plurality of first touch signal lines transmit a touch detection signal to the plurality of first touch electrodes electrically connected to the plurality of touch switch units that are turned-on.

2. The display panel according to claim 1, wherein in a same touch switch unit of the plurality of touch switch units, the at least one first touch switch is disposed in a same second spacing region.

3. The display panel according to claim 1, wherein in a same touch switch unit with two or more first touch switches of the plurality of touch switch units, the first touch switches are distributed in different second spacing regions.

4. The display panel according to claim 3, wherein each of the second spacing regions corresponding to a same touch switch unit of the plurality of touch switch units respectively includes a plurality of first touch switches.

5. The display panel according to claim 1, wherein each second spacing region includes the plurality of first touch switches.

6. The display panel according to claim 1, wherein the plurality of transistors include a channel region, and an orthographic projection of the channel region on the plane of the base substrate is L-shaped.

7. The display panel according to claim 1, further comprising a plurality of gate lines extending in the first direction and arranged in the second direction, and a plurality of data lines arranged in the first direction and extending in the second direction, wherein:

a same first spacing region includes one gate line, and a same gate line of the plurality of gate lines simultaneously supplies a scan signal to the plurality of sub-pixels in an odd-numbered row and an even-numbered row; and the plurality of data lines include a first data line and a second data line, wherein in a same column of sub-pixels, the first data line is electrically connected to the sub-pixels in odd-numbered rows, and the second data line is electrically connected to the sub-pixels in even-numbered rows.

8. The display panel according to claim 7, wherein:

the plurality of transistors include a first transistor and a second transistor, wherein the first transistor is electrically connected to the plurality of pixel electrodes of the odd-numbered row, and the second transistor is electrically connected to the plurality of pixel electrodes of the even-numbered row;

in the plurality of sub-pixels of two adjacent odd-numbered row and even-numbered row, gates of the first transistors and the second transistors are connected to a same gate line of the plurality of gate lines;

first poles of the first transistors and the second transistors are electrically connected to the plurality of pixel electrodes in one-to-one correspondence; and in the plurality of sub-pixels of a same column, second poles of first transistors are connected to a same first data line, and second poles of second transistors are connected to a same second data line.

9. The display panel according to claim 1, further comprising a plurality of gate lines extending in the first direction and arranged in the second direction, and a plurality of data lines arranged in the first direction and extending in the second direction, wherein:

the plurality of gate lines include a first gate line and a second gate line, wherein the first gate line supplies a scan signal to the plurality of sub-pixels in an odd-numbered row, the second gate line provides a scan signal to the plurality of sub-pixels in an even-numbered row, and the first gate line and the second gate line corresponding to two adjacent rows of sub-pixels are located in a same first spacing region; and the plurality of data lines include a first data line and a second data line, wherein in a same sub-pixel column, the first data line is electrically connected to the plurality of sub-pixels in the odd-numbered rows, and the second data line is electrically connected to the plurality of sub-pixels in the even-numbered rows.

10. The display panel according to claim 9, wherein:

the plurality of transistors include a first transistor and a second transistor, wherein the first transistors are electrically connected to the plurality of pixel electrodes at the odd-numbered rows, and the second transistors are electrically connected to the plurality of pixel electrodes at the even-numbered rows;

in the plurality of sub-pixels of one odd-numbered row, gates of the first transistors are connected to a same first gate line, and in the plurality of sub-pixels of one even-numbered row, gates of the second transistors are connected to a same second gate line;

first poles of the first transistors and the second transistors are electrically connected to the plurality of pixel electrodes in one-to-one correspondence; and in the plurality of sub-pixels of a same column, second poles of the first transistors are connected to a same first data line, and the second poles of the second transistors are connected to a same second data line.

11. The display panel according to claim 1, wherein:

a same touch switch unit of the plurality of touch switch units includes a plurality of first touch switches, and a same touch electrode column of the plurality of touch electrode columns corresponds to one first touch signal line of the plurality of first touch signal lines; and in a same touch switch unit of the plurality of touch switch units, first poles of the plurality of first touch switches are connected to a same first touch signal line of the plurality of first touch signal lines, control terminals of the plurality of first touch switches are connected to different second touch signal lines of the plurality of second touch signal lines, and second poles of the plurality of first touch switches are electrically connected to a same first touch electrode of the plurality of first touch electrodes, respectively.

12. The display panel according to claim 1, wherein:

a same touch switch unit of the plurality of touch switch units includes a plurality of first touch switches, and a same touch electrode column of the plurality of touch electrode columns corresponds to n first touch signal lines of the plurality of first touch signal lines, where n≥2;

in a same touch switch unit of the plurality of touch switch units, a plurality of first touch switches form m touch switch columns arranged in the first direction, and each touch switch column includes at least one of the plurality of first touch switches, where m=n;

first poles of the plurality of first touch switches at a same touch switch column are connected to a same first touch signal line of the plurality of first touch signal lines, and the plurality of first touch switches at different touch switch columns are connected to different first touch signal lines of the plurality of first touch signal lines; and in a same touch switch unit of the plurality of touch switch units, control terminals of the plurality of first touch switches are connected to at least one same driving circuit of the plurality of driving circuits and second poles of the plurality of first touch switches are electrically connected to a same first touch electrode of the plurality of first touch electrodes, respectively.

13. The display panel according to claim 1, wherein:

the plurality of second touch signal lines corresponding to a same touch electrode row of the plurality of touch electrode rows are electrically connected to a same driving circuit of the plurality of driving circuits, and the plurality of driving circuits are located on a same side of the display area in the first direction; or the plurality of driving circuits electrically connected to the plurality of second touch signal lines corresponding to two adjacent touch electrode rows of the plurality of touch electrode rows are respectively located on two opposite sides of the display area in the first direction.

14. The display panel according to claim 1, wherein:

the plurality of second touch signal lines corresponding to a same touch electrode row of the plurality of touch electrode rows are simultaneously electrically connected to two driving circuits of the plurality of driving circuits; and the two driving circuits of the plurality of driving circuits electrically connected to the plurality of second touch signal lines corresponding to a same touch electrode row of the plurality of touch electrode rows are respectively located at two opposite sides of the display area in the first direction.

15. A driving method for a display panel, the display panel including: a plurality of sub-pixels arranged in a first direction and a second direction, wherein the plurality of sub-pixels located in a display area and arranged in a first direction and a second direction intersecting the first direction, wherein the plurality of sub-pixels include a pixel electrode and a transistor electrically connected to the pixel electrode in one-to-one correspondence, and a plurality of pixel electrodes form a plurality of pixel electrode rows extending in the first direction and arranged in the second direction, a spacing region is formed between any two adjacent pixel electrode rows of the plurality of pixel electrode rows, the spacing region extends in the first direction and includes a first spacing region and a second spacing region arranged in the second direction, and a plurality of transistors of two adjacent rows of sub-pixels are located in a same first spacing region; a plurality of touch electrode rows, and a plurality of touch electrode columns, wherein each touch electrode row and each touch electrode column respectively include a plurality of first touch electrodes, and an orthographic projection of one first touch electrode of the plurality of first touch electrodes on a plane of a base substrate covers at least two sub-pixels; a plurality of touch switch units located in the second spacing regions, wherein each touch switch unit includes at least one first touch switch, and one first touch electrode is electrically connected to a first pole of the at least one first touch switch of a corresponding touch switch unit of the plurality of touch switch units; a plurality of first touch signal lines, wherein a same touch electrode column of the plurality of touch electrode columns corresponds to at least one first touch signal line, and a same first touch signal line of the plurality of first touch signal lines is electrically connected to a second pole of the at least one first touch switch of a touch switch unit corresponding to the same touch electrode column, wherein each touch electrode column has at least two first touch electrodes of the plurality of first touch electrodes connecting with a same first touch signal lines of the plurality of first touch signal lines, the at least one first touch signal line corresponding to the same touch electrode column is connected to a same first signal terminal, and the plurality of first touch signal lines corresponding to different touch electrode columns of the plurality of touch electrode columns are connected to different first signal terminals; a plurality of second touch signal lines, wherein a same touch electrode row of the plurality of touch electrode rows corresponds to at least one second touch signal line, and a same second touch signal line of the plurality of second touch signal lines is electrically connected to a gate of the at least one first touch switch of a touch switch unit corresponding to one first touch electrode of the plurality of first touch electrodes in the same touch electrode row; and a plurality of driving circuits located in a non-display area, wherein each second touch signal line of the plurality of second touch signal lines corresponding to a same touch electrode row of the plurality of touch electrode rows is connected to at least a same driving circuit of the plurality of driving circuits, the method comprising:
- in a touch stage, the plurality of driving circuit providing a driving signal to the plurality of second touch signal line corresponding to the plurality of touch electrode rows, such that the plurality of touch switch units that are electrically connected to the plurality of second touch signal lines are turned on; and
- the plurality of first touch signal lines transmitting a touch detection signal to the plurality of first touch electrodes electrically connected to the plurality of touch switch units that are turned-on.

16. The driving method according to claim 15, wherein:
a plurality of transistors include a first transistor and a second transistor, wherein the first transistor is electrically connected to the plurality of pixel electrodes of an odd-numbered row, and the second transistor is electrically connected to the plurality of pixel electrodes of an even-numbered row;
the display panel further includes a plurality of gate lines extending in the first direction and arranged in the second direction, and a plurality of data lines arranged in the first direction and extending in the second direction, wherein a same gate line of the plurality of gate lines simultaneously supplies a scan signal to the plurality of sub-pixels of an odd-numbered row and an even-numbered row, respectively;
the plurality of data lines include a first data line and a second data line, wherein, in a same column of sub-pixels, the first data line is electrically connected to the plurality of sub-pixels in the odd-numbered rows, and the second data line is electrically connected to the plurality of sub-pixels in the even-numbered rows; and
the driving method further comprises a driving method for a display stage, wherein:
in the display stage, a control signal is sequentially transmitted to the plurality of gate lines, such that the first transistors electrically connected to the plurality of pixel electrodes of the odd-numbered row corresponding to the plurality of gate lines and the second transistors electrically connected to the plurality of pixel electrodes of the even-numbered row corresponding to the plurality of gate lines are simultaneously turned on; and
data signals are transmitted to the plurality of pixel electrodes located in the odd-numbered row through the first data line, and meanwhile data signals are transmitted to the plurality of pixel electrodes located in the even-numbered row through the second data line.

17. The display panel according to claim 15, wherein:
the plurality of sub-pixel include a pixel electrode and a transistor electrically connected to the pixel electrode in one-to-one correspondence, and a plurality of transistors include a first transistor and a second transistor, wherein the first transistor is electrically connected to a plurality of pixel electrodes at an odd-numbered row, and the second transistor is electrically connected to the plurality of pixel electrode at an even-numbered row;
the display panel further comprises a plurality of gate lines extending in the first direction and arranged in the second direction, and a plurality of data lines arranged in the first direction and extending in the second direction, wherein the plurality of gate lines include a first gate line and a second gate line, and the plurality of data lines include a first data line and a second data line; and
the driving method further comprises a driving method for a display stage, wherein:
in the display stage, a control signal is alternately transmitted to the first gate line and the second gate line, such that the first transistors electrically connected to the plurality of pixel electrodes at the odd-numbered row and the second transistors electrically connected to the plurality of pixel electrodes at the even-numbered row are alternately turned on; and
data signals are transmitted to the plurality of pixel electrodes located in the odd-numbered row through the first data line, and the data signals are transmitted to the plurality of pixel electrodes located in the even-numbered row through the second data line.

18. A touch display device, comprising:
a display panel, including:
a display area;
a non-display area surrounding the display area;
a base substrate;
a plurality of sub-pixels located in the display area and arranged in a first direction and a second direction intersecting the first direction, wherein:
each sub-pixel includes a pixel electrode and a transistor electrically connected to the pixel electrode in one-to-one correspondence, and a plurality of pixel electrodes form a plurality of pixel electrode rows extending in the first direction and arranged in the second direction;
a spacing region is formed between any two adjacent pixel electrode rows of the plurality of pixel electrode rows, the spacing region extends in the first direction, and includes a first spacing region and a second spacing region alternately arranged in the second direction; and
a plurality of transistors of two adjacent rows of sub-pixels are located in a same first spacing region; and
a plurality of touch electrode rows extending in the first direction and arranged in the second direction, and a plurality of touch electrode columns arranged in the first direction and extending in the second direction, wherein each touch electrode row and each touch electrode column respectively include a plurality of first touch electrodes, and an orthographic projection of one first touch electrode of the plurality of first touch electrodes on a plane of the base substrate covers at least two sub-pixels;
a plurality of touch switch units located in the second spacing regions, wherein each touch switch unit includes at least one first touch switch, and one first touch electrode is electrically connected to a first pole of the at least one first touch switch of a corresponding touch switch unit of the plurality of touch switch units;

a plurality of first touch signal lines, wherein a same touch electrode column of the plurality of touch electrode columns corresponds to at least one first touch signal line, and a same first touch signal line of the plurality of first touch signal lines is electrically connected to a second pole of the at least one first touch switch of a touch switch unit corresponding to the same touch electrode column, wherein each touch electrode column has at least two first touch electrodes of the plurality of first touch electrodes connecting with a same first touch signal lines of the plurality of first touch signal lines, the at least one first touch signal line corresponding to the same touch electrode column is connected to a same first signal terminal, and the plurality of first touch signal lines corresponding to different touch electrode columns of the plurality of touch electrode columns are connected to different first signal terminals;

a plurality of second touch signal lines, wherein a same touch electrode row of the plurality of touch electrode rows corresponds to at least one second touch signal line, and a same second touch signal line of the plurality of second touch signal lines is electrically connected to a gate of the at least one first touch switch of a touch switch unit corresponding to one first touch electrode of the plurality of first touch electrodes in the same touch electrode row; and a plurality of driving circuits located in the non-display area, wherein each second touch signal line of the plurality of second touch signal lines corresponding to a same touch electrode row of the plurality of touch electrode rows is connected to at least a same driving circuit of the plurality of driving circuits, wherein:

in a touch stage, the plurality of driving circuits supply a driving signal to the plurality of second touch signal lines corresponding to the plurality of touch electrode rows, such that the plurality of touch switch units electrically connected to the plurality of second touch signal lines are turned on; and the plurality of first touch signal lines transmit a touch detection signal to the plurality of first touch electrodes electrically connected to the plurality of touch switch units that are turned-on.

* * * * *